US007411305B2

(12) United States Patent
Voldman

(10) Patent No.: US 7,411,305 B2
(45) Date of Patent: Aug. 12, 2008

(54) INTERCONNECT STRUCTURE ENCASED WITH HIGH AND LOW K INTERLEVEL DIELECTRICS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,359

(22) Filed: May 9, 2005

(65) Prior Publication Data
US 2006/0249787 A1 Nov. 9, 2006

(51) Int. Cl.
*H01L 23/52* (2006.01)
*H01L 23/48* (2006.01)
*H01L 23/40* (2006.01)
*H01L 21/768* (2006.01)
*H01L 21/44* (2006.01)
*H01L 21/8238* (2006.01)
*H01L 21/336* (2006.01)

(52) U.S. Cl. .................. 257/774; 257/775; 257/776; 257/E21.575; 257/E21.597; 438/667; 438/672; 438/216; 438/287

(58) Field of Classification Search ............... 257/774, 257/775, 776, 624, 625, E21.575, E21.597; 438/667, 672, 216, 287
See application file for complete search history.

(56) References Cited

U.S. PATENT DOCUMENTS

| 5,514,892 | A | * | 5/1996 | Countryman et al. | ....... 257/355 |
| 5,744,865 | A | | 4/1998 | Jeng et al. | |
| 5,821,621 | A | | 10/1998 | Jeng | |
| 7,052,990 | B2 | * | 5/2006 | Kim | ........................ 438/637 |
| 2006/0134836 | A1 | * | 6/2006 | Knapp et al. | ................ 438/126 |

* cited by examiner

*Primary Examiner*—Luan Thai
(74) *Attorney, Agent, or Firm*—Anthony J. Canale

(57) ABSTRACT

A structure for improving the electrostatic discharge robustness of an integrated circuit having an electrostatic discharge (ESD) device and a receiver network connected to a pad by interconnects. The interconnect between the pad and the ESD device has a high-k material placed adjacent to at least one surface of the interconnect and extending over the thermal diffusion distance of the interconnect. The high-k material improves the critical current density of the interconnect by increasing the heat capacity and thermal conductivity of the interconnect. The high-k material can be placed on the sides, top and/or bottom of the interconnect. In multiple wire interconnects, the high-k material is placed between the wires of the interconnect. A low-k material is placed beyond the high-k material to reduce the capacitance of the interconnect. The combination of low-k and high-k materials provides an interconnect structure with improved ESD robustness and low capacitance that is well suited for an ESD device. The interconnect to the receiver, which does not carry a high current, is surrounded by a low-k material for reduced capacitance and performance advantages.

2 Claims, 8 Drawing Sheets

INTERCONNECT STRUCTURE ENCASED WITH HIGH AND LOW K INTERLEVEL DIELECTRICS

FIELD OF THE INVENTION

The present invention relates generally to interconnects for electrostatic discharge (ESD) networks and receiver networks. More particularly, the present invention relates to structures for improving the thermal conductivity and ESD robustness of such interconnects by encasing the interconnects in a combination of high-k and low-k interlevel dielectric (ILD) materials.

BACKGROUND OF THE INVENTION

Semiconductor devices are typically interconnected by patterned electrically conductive layers of high conductivity metal or metal alloy, commonly referred to as interconnects or interconnect wires. Complex circuits require very close spacing of interconnect wires and multiple levels of metalization to interconnect the semiconductor devices. Interconnects are made by depositing and patterning alternating layers of a conductive material and layers of an insulating dielectric material. In multilevel interconnects, small holes or contact vias are formed through the dielectric layers and filled with conductive material to interconnect the conductive layers.

The interlevel dielectric material is typically $SiO_2$, which has a dielectric constant, k, of about 4.0. Efforts have been made to replace the $SiO_2$ dielectric with materials having lower dielectric constants. As used herein, a low dielectric material or low-k material means a material having a dielectric constant, k, of lower than about 3.5 and preferably lower than about 3. As used herein, a high dielectric material or high-k material means a material having a dielectric constant, k, of higher than about 3.5 and preferably about 4.0.

With today's more demanding circuit density, wirability, array-I/O architecture and receiver performance requirements, semiconductor chip performance is requiring the transition from Al to Cu interconnects because of the impact of interconnect RC delay on MOSFET gate delay analysis. The interconnect delay components become a larger percentage of the total CMOS gate delay as the intrinsic delay decreases and must be reduced either through interconnect resistance or capacitance reduction. Interconnect RC delay can be reduced by migrating from Al- to Cu-based interconnects, which improves electrical conductivity.

The transition from Al-to-Cu interconnects is not only important for semiconductor chip performance objectives, it is also important for ESD robustness in high-performance chips. Aluminum interconnects are a significant ESD failure mechanism in high-pin-count microprocessor chips. The migration from Al- to Cu-based interconnects achieved a two-fold improvement in critical current density-to-failure, $J_{crit}$, in a $SiO_2$ ILD. The Al-to-Cu technology migration path led to continuous ESD improvement, allowing for metal film thickness and line width scaling.

The interconnect component of gate RC delay can be further reduced (i.e. line to line capacitance) by using low-k materials instead of $SiO_2$ ILD. Cu interconnects and low-k materials enable the semiconductor industry to meet signal-delay requirements down to at least 100 nm technology.

Low-k materials must also have low leakage, a low thermal coefficient of expansion, high breakdown voltage, low film stress, high cracking resistance and compatibility and integrability with Cu interconnects. Low-k materials include, for example, silicon oxyfluoride ($F_xSiO_y$), hydrogen silsequioxane (HSQ), organic polymers such as poly(arelene) ethers, benzoncyclobutene (BCB), nanoporous silica and porous polymers. Other low-k materials such as, for example, Silicon Low-k (SiLK) from Dow Chemical Corp., Midland, Mich., having suitable material properties, compatibility with Cu interconnects, and the desired electrical permittivity will be known to those skilled in the art.

From an ESD perspective, the thermal properties of low-k materials are key to understanding the ESD robustness of Cu interconnect systems and the scaling implications on ESD robustness. Low-k materials have different thermal and mechanical properties which are a significant deviation from $SiO_2$ dielectrics. The mass density, thermal conductivity, and the specific heat all influence the thermal characteristics of the ILD through the thermal resistance and thermal capacity. Models have been developed for determining the power-to-failure and critical-current-density-to-failure in the thermal diffusion time scale for various interconnect structures, as described in S. Voldman et al., "High-Current Characterization of Dual-Damascene Copper Interconnects in $SiO_2$ and Low-k Interlevel Dielectrics for Advanced CMOS Semiconductor Technologies," *International Reliablity Physics Symposium*, Mar. 22, 1999.

The trend in the industry, especially with integrated circuits, has been to use low-k materials near the interconnect wires to improve the performance of the circuit. For example, U.S. Pat. Nos. 5,744,865 and 5,821,621 disclose interconnect structures having a low-k material placed between the multiple wires of the interconnect. The low-k material reduces the capacitance of the interconnect and helps reduce crosstalk noise between adjacent wires carrying different signals from different pads. However, the interconnects surrounded by low-k materials are not well suited for applications where ESD robustness is more important than performance, such as interconnects between pads and ESD devices or other devices for discharging or sinking a current. Such applications are the focus of the present invention.

SUMMARY OF THE INVENTION

It is an advantage of the present invention to provide an interconnect structure that improves the ESD robustness of semiconductor chips.

It is a further advantage of the present invention to provide an interconnect structure that allows thermal heat to penetrate a short distance into the surrounding insulators of the interconnect between an ESD device and a pad to increase the ESD robustness of the interconnect.

It is a further advantage of the present invention to provide an interconnect structure that has an improved critical current density-to-failure robustness without increasing the capacitance of the interconnect.

The present invention is directed to a semiconductor structure having an ESD device and a receiver network connected to a pad by interconnects. The interconnect between the pad and the ESD device has a high-k material placed on at least one edge or surface of the interconnect within the thermal diffusion distance of the interconnect on an ESD pulse time scale. The high-k material improves the critical current density of the interconnect by increasing the heat capacity and thermal conductivity of the interconnect. The high-k material can be placed on the sides, top and/or bottom of the interconnect extending between the pad and the ESD device to improve the ESD robustness. In multiple wire interconnects extending between the pad and the ESD device, the high-k material is placed between the wires of the interconnect.

A low-k material is placed beyond the high-k material (i.e., beyond the thermal diffusion distance of the interconnect) to reduce the capacitance of the interconnect. The combination of low-k and high-k materials provides an interconnect structure with improved ESD robustness and low capacitance that is well suited for connecting the pad to the ESD device. The interconnect to the receiver, which is a functional circuit that does not carry a high current, is surrounded by a low-k material for reduced capacitance and performance advantages. Since this interconnect does not carry a high current, ESD robustness is much less of a concern than capacitance and performance.

According to a broad aspect of the present invention, an integrated circuit apparatus is provided, comprising: an electrostatic (ESD) device; a pad; an interconnect electrically connecting the pad and the ESD device; a high-k material placed adjacent to at least one surface of the interconnect for increasing an electrostatic discharge robustness of the interconnect; and a low-k material placed adjacent to the high-k material for reducing a capacitance of the interconnect.

The interconnect may comprise a plurality of interconnect wires with the high-k material disposed between the interconnect wires. The high-k material can also be disposed above and/or below the interconnect wires. The high-k material preferably has a thickness equal to or greater than a thermal diffusion distance of the interconnect.

According to another broad aspect of the present invention, an integrated circuit apparatus is provided, comprising: a first device for discharging a current; a functional circuit; a pad; a first interconnect electrically connecting the pad and the first device; a second interconnect electrically connecting the functional circuit to the first device or the pad; a high-k material placed adjacent to at least one surface of the first interconnect; and a low-k material placed adjacent to at least one surface of the second interconnect.

According to yet another broad aspect of the present invention, an interconnect structure is provided, comprising: a metal conductor; a high-k material placed adjacent to at least one surface of the metal conductor for increasing an electrostatic discharge robustness of the interconnect structure; and a low-k material placed adjacent to the high-k material for reducing a capacitance of the interconnect structure.

Numerous other features and advantages of the present invention will be apparent to those skilled in this art from the following description wherein there is shown and described a preferred embodiment of the present invention, simply by way of illustration of one of the modes best suited to carry out the invention. As will be realized, the invention is capable of other different embodiments, and its several details are capable of modification in various obvious aspects without departing from the invention. Accordingly, the drawings and description should be regarded as illustrative in nature and not restrictive.

BRIEF DESCRIPTION OF THE DRAWINGS

The present invention will become more clearly appreciated as the disclosure of the invention is made with reference to the accompanying drawings.

DETAILED DESCRIPTION OF THE PREFERRED EMBODIMENT

A preferred embodiment of the present invention will now be described with reference to the accompanying drawings.

Figure 1:
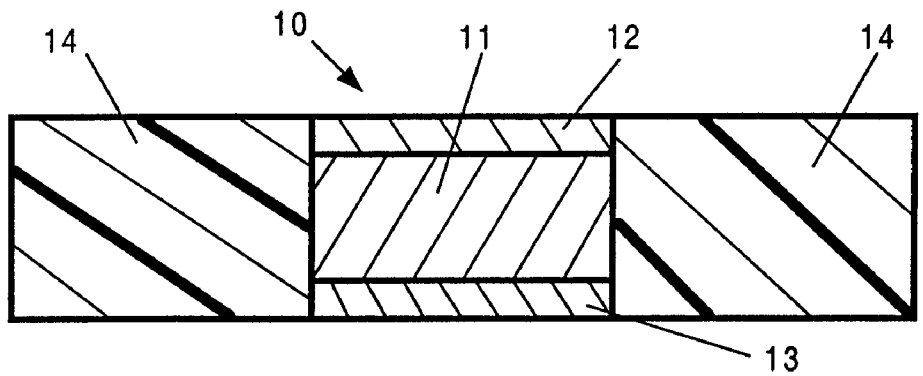
FIG. 1 is a cross-sectional view of a nondamascene type aluminum interconnect.

The present invention is directed to improvements in interconnect structures used in semiconductor devices. Such interconnect structures typically have one or more conductor wires, such as aluminum (Al) or copper (Cu) wires, surrounded by insulator materials. FIG. 1 shows a cross section of an Al-based interconnect 10 having a layer 11 of Al sandwiched between upper and lower layers 12, 13 of a refractory metal, such as titanium (Ti) or titanium nitride (TiN). An insulator material 14 is disposed on the sides of the interconnect 10.

Figure 2A:
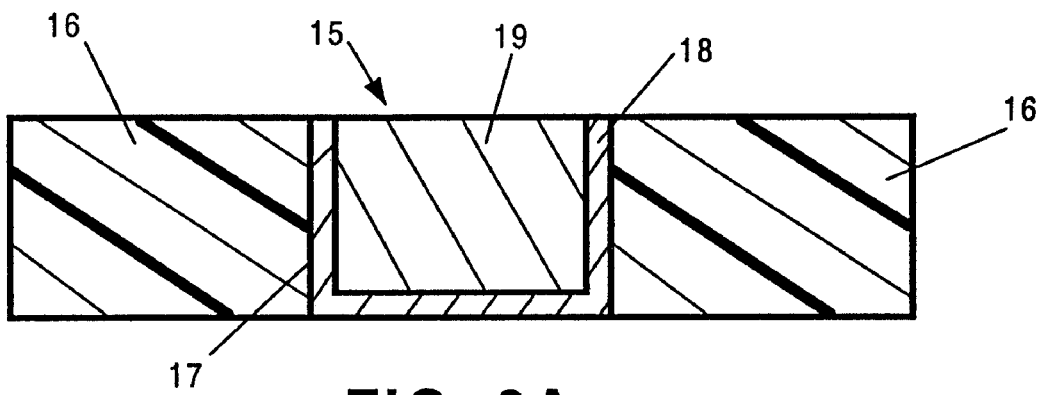
FIG. 2A is a cross-sectional view of a damascene type copper interconnect.

FIG. 2A shows a cross section of a Cu-based interconnect 15 having a damascene structure. The interconnect 15 has an insulator 16 in which a trough 17 is formed by a reactive ion etching process or the like. A liner 18 is deposited on the surface of the trough 17. A copper material 19 is then deposited on top of the liner material 18. The liner material 18 is typically a refractory metal, such as tungsten, titanium, tantalum, tantalum nitride, and so forth.

Figure 2B:
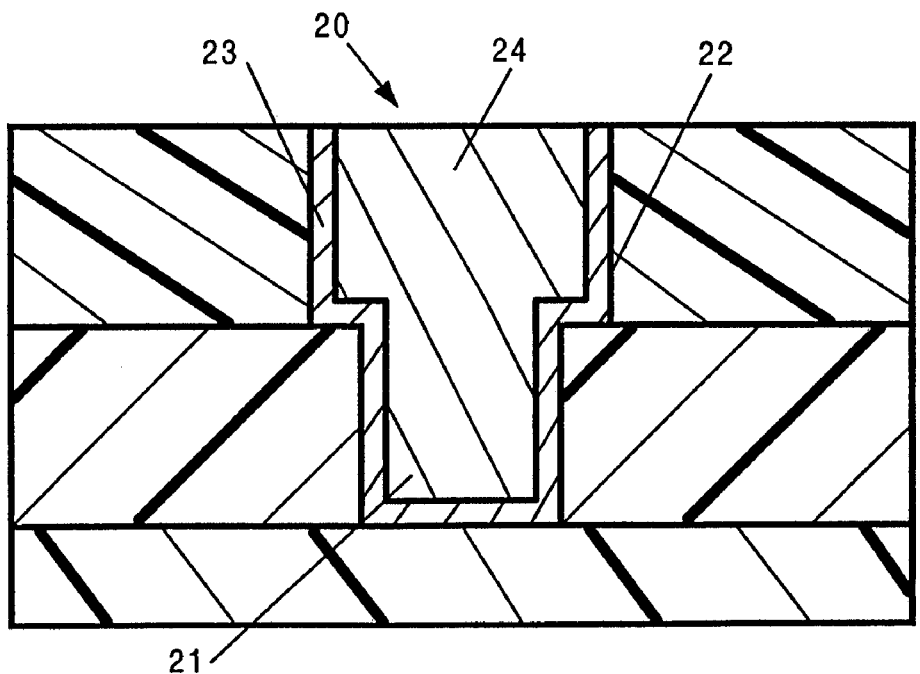
FIG. 2B is a cross-sectional view of a dual damascene type copper interconnect.

As shown in FIG. 2B, an interconnect 20 can also be formed using a dual damascene process that produces the interconnect 20 and a via 21 below the interconnect 20 at the same time. As shown in FIG. 2B, the dual damascene structure has a two-step trough 22 formed, for example, by an ion etching process. The two-step trough 22 is followed by applying a liner material 23 and a copper fill 24 into the trough 22, and a polish step to define the interconnect 20. The interconnect structure of the present invention preferably has a damascene structure with a copper wire and liner material. This provides the best interconnect ESD robustness due to the high current, low resistance and high melting temperature of the copper interconnect. It will be appreciated by those skilled in the art that other suitable interconnect materials, such as Al, can also be used.

Figure 3:
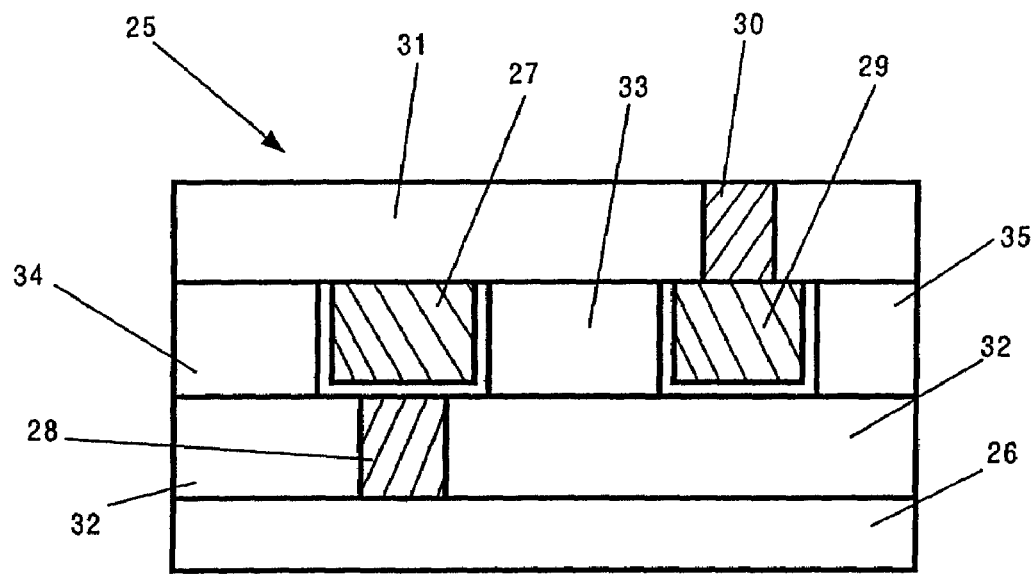
FIG. 3 is a cross-sectional view of a conventional semiconductor wafer with a silicon substrate and high-k material placed between and surrounding the interconnects.

FIG. 3 shows a cross section of a conventional semiconductor wafer 25 with a silicon substrate 26, a first damascene interconnect 27, a contact 28 extending downwardly from the first interconnect 27, a second damascene interconnect 29, and a via 30 extending upwardly from the second interconnect 29. Layers 31, 32, 33, 34, 35 of high-k material, such as $SiO_2$, are provided above, below and between the interconnects 27 and 29, and on the outer sides of the interconnects 27 and 29, respectively. The structure shown in FIG. 3 can be produced using a single damascene or a dual damascene process, and is typical in the semiconductor industry.

Figure 4:
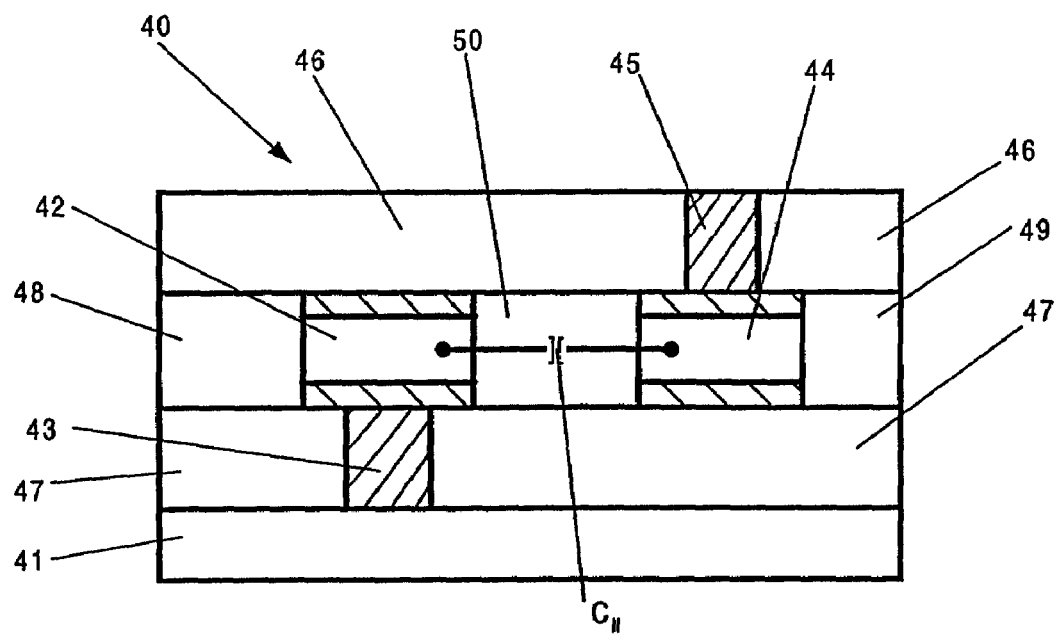
FIG. 4 is a cross-sectional view of a conventional semiconductor wafer with a silicon substrate, a low-k material placed between two interconnects, and a high-k material surrounding the interconnects.

FIG. 4 is another conventional semiconductor structure 40 similar to the structure shown in FIG. 3. This structure 40 includes a silicon substrate 41, a first damascene interconnect 42, a contact 43 extending downwardly from the first interconnect 42, a second damascene interconnect 44, and a via 45 extending upwardly from the second interconnect 44. Layers 46, 47, 48, 49 of high-k material, such as $SiO_2$, are provided above and below the interconnects 42, 44, and on the outer sides of the interconnects 42 and 44, respectively. A layer 50 of low-k material is provided between the interconnects 42, 44. The low-k material 50 lowers the line-to-line capacitance $C_{II}$ between the wires of the interconnects 42, 44.

Figure 5:
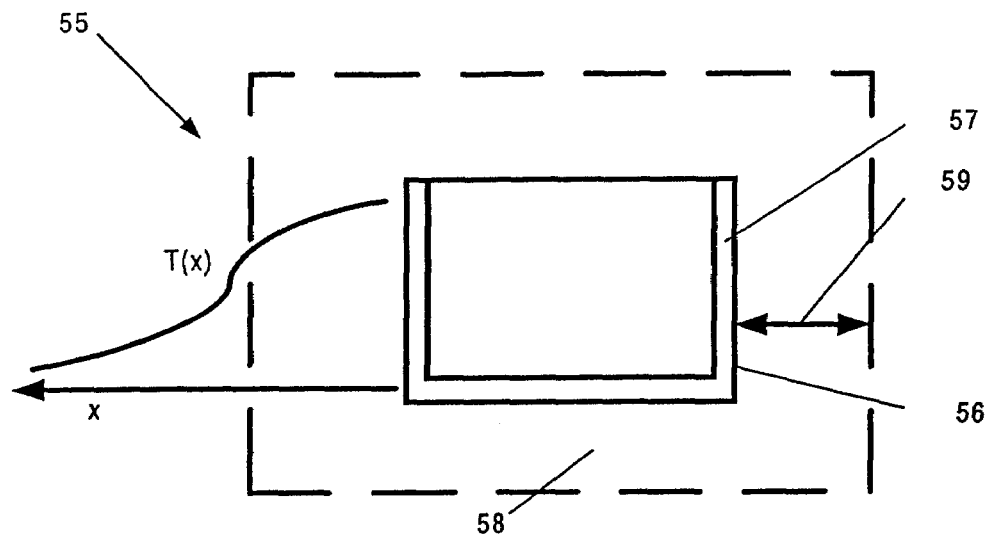
FIG. 5 is a cross-sectional diagram showing the thermal characteristics of an interconnect.

FIG. 5 shows a cross section of an interconnect 55 and illustrates the thermal characteristics of the interconnect 55. The interconnect 55 in FIG. 5 has a trough 56, a liner 57 on three sides, and an insulator 58 surrounding an outside of the liner 57. When the interconnect 55 self-heats, the heat dissipates into the surrounding insulator 58 forming a thermal sheath 59 about the interconnect 55. The temperature T(x) decreases as the distance x from the liner 57 increases.

Figure 6:
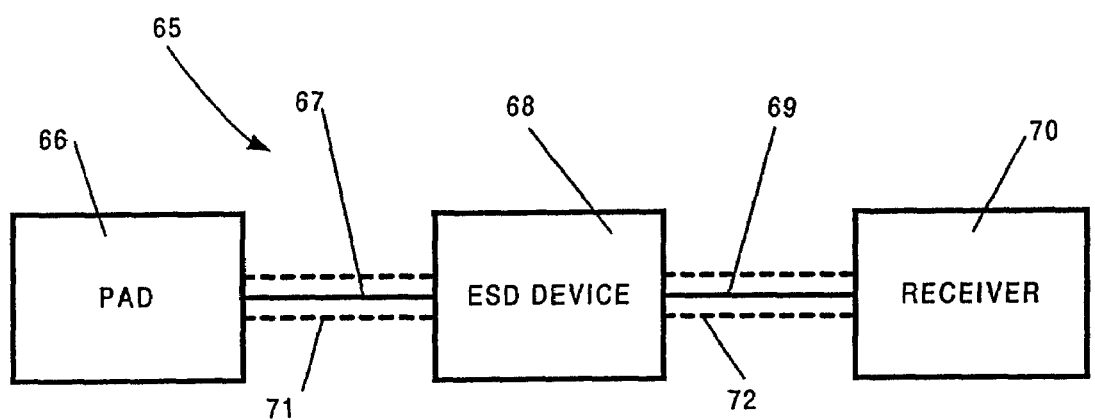
FIG. 6 shows a conventional I/O and ESD device.

FIG. 6 shows a conventional I/O and ESD device 65 having a pad 66, a first interconnect 67 between the pad 66 and an ESD device 68, and a second interconnect 69 between the ESD device 68 and a receiver circuit 70. The second interconnect 69 is shown as following the ESD device 68 in series to the receiver circuit 70. However, the receiver circuit 70 can also be connected in parallel directly to the pad 66. In this conventional structure, the first and second interconnects 67, 69 are both surrounded by a high-k material 71, 72, such as $SiO_2$.

The ESD robustness of an interconnect is a function of the heat capacity of the metal wire, the heat capacity of the liner material, and the heat capacity of the insulator around the liner material. The electrical permittivity of a material generally tracks with the thermal conductivity. When the insulator material around the interconnect is a low-k material, the capacitance of the interconnect is reduced and the performance is improved. However, the electrical and thermal characteristics of the low-k material are such that the critical current density and ESD robustness of the interconnect suffer.

The present invention is based on the premise that the volume surrounding the metal interconnect can participate in and help improve the overall ESD robustness of the interconnect. Therefore, if the material surrounding the metal interconnect is a high-k material, its heat capacity and thermal conductivity are such that more heat energy can be stored and dissipated in the surrounding insulator materials. The present invention takes advantage of the properties of different insulator materials to improve the ESD robustness of the interconnect while maintaining a suitable level of capacitance and performance.

Figure 7:
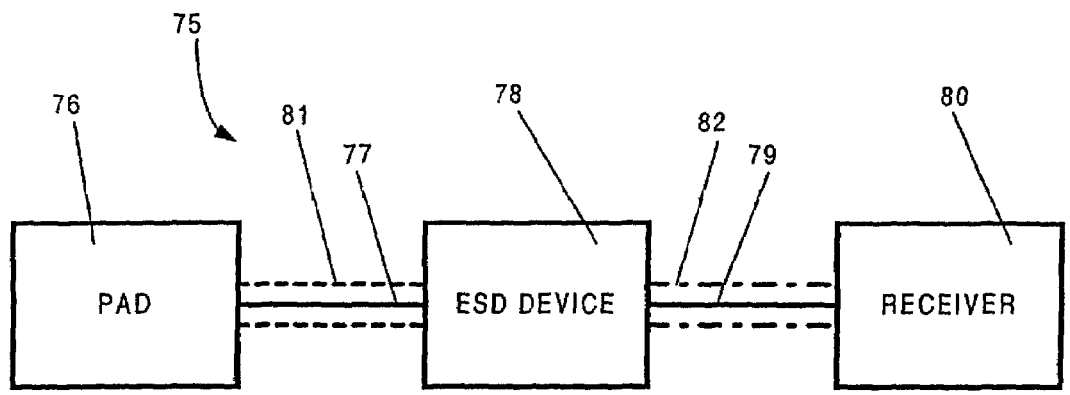
FIG. 7 shows an I/O and ESD device according to the present invention having a first interconnect between a pad and an ESD device encased in a high-k material, and a second interconnect to a receiver encased in a low-k material.

FIG. 7 shows an I/O and ESD device 75 according to the present invention having a pad 76, a first interconnect 77 between the pad 76 and an ESD device 78, and a second interconnect 79 between the ESD device 78 and a receiver circuit 80. The receiver 80 can be connected in series to ESD device 78, as shown in FIG. 7, or it can be connected in parallel directly to the pad 76. The first interconnect 77 between the pad and the ESD is encased in a high-k material 81, such as $SiO_2$, to take advantage of the thermal properties of the high-k material to improve the critical current density and ESD robustness of the interconnect 77.

The second interconnect 79 that extends to the receiver 80, which is a functional circuit that typically does not carry a high current, is surrounded by a low-k material 82. Since the second interconnect 79 does not carry a high current, there is no advantage to encasing the second interconnect 79 in a high-k material. In fact, it would normally be a disadvantage to encase the second interconnect 79 in a high-k material because of the capacitance loading effects of that wire. However, if the receiver performance is not an issue or there exists current carrying elements in the receiver circuit 80 (e.g., NFET clamps, second stage ESD elements, etc.), the interconnect 79 between the receiver 80 and the ESD device 78 can also be encased, or partially encased, in a high-k material.

The structure 75 shown in FIG. 7 has a high-k material 81 encasing the first interconnect 77 between the pad 76 and the ESD device 78 for improved ESD robustness, and a low-k material 82 surrounding the second interconnect 79 to the receiver 80 for performance advantages. The first and second interconnects 77, 79 can be single wire or multiple wire structures.

Figure 8:
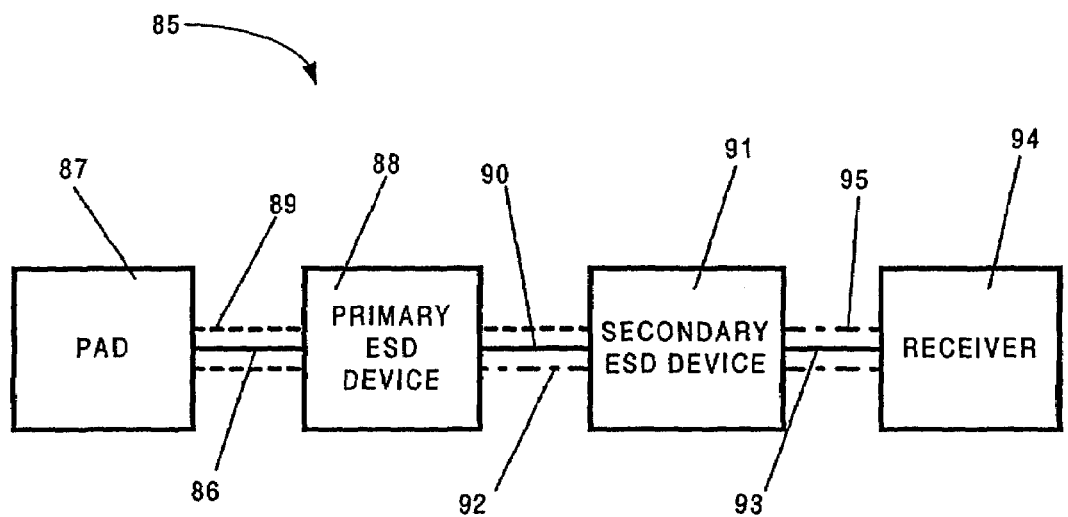
FIG. 8 shows an ESD implementation according to the present invention where a plurality of ESD devices are connected together.

FIG. 8 shows an ESD implementation 85 according to the present invention where a plurality of ESD devices are connected together. In this implementation, a first interconnect 86 between a pad 87 and a primary ESD 88 is encased with a high-k material 89 for improved thermal properties. A second interconnect 90 between the primary ESD 88 and a secondary ESD 91 is encased with a material 92 which is either a high-k material or a low-k material, and a third interconnect 93 to the receiver 94 is surrounded with a low-k material 95 to reduce capacitance and improve performance.

Figure 9:
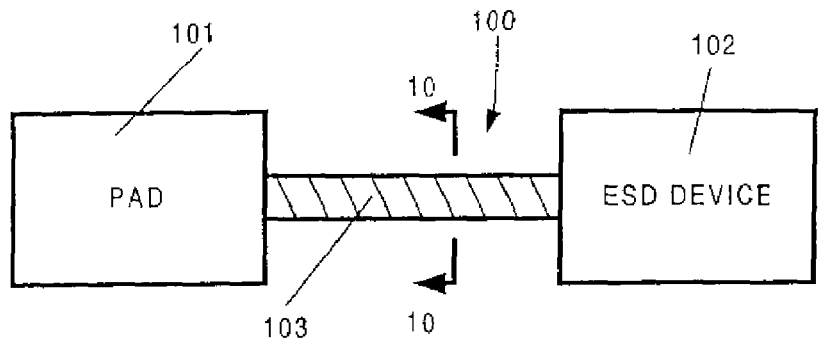
FIG. 9 shows a single wire interconnect extending from a pad to an ESD device.
Figure 10:
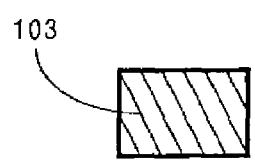
FIG. 10 is a cross-sectional view of a single wire interconnect, as viewed along line 10-10 in FIG. 9.

As shown in FIG. 9, an interconnect 100 between a pad 101 and an ESD device 102 typically comprises a single interconnect wire 103 extending between the pad 101 and the ESD device 102, at least for the predominantly long run until the interconnect wire 103 enters the ESD device 102. FIG. 10 shows a cross section of the single wire interconnect 103 leading from the pad 101 to the ESD device 102, as viewed along line 10-10 in FIG. 9.

Figure 11:
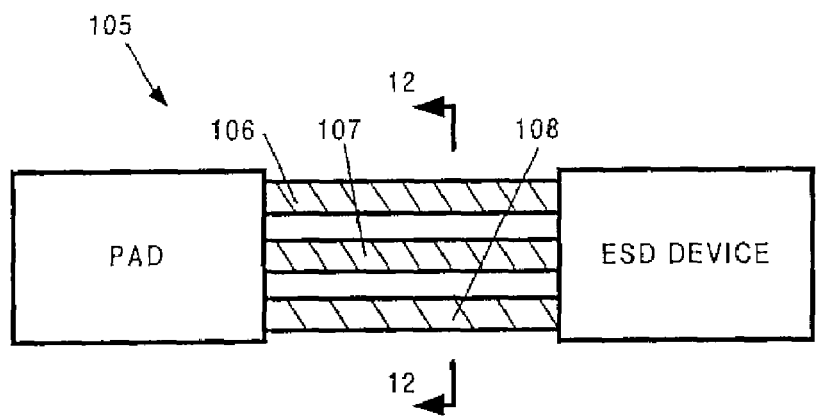
FIG. 11 shows a multiple wire interconnect extending from a pad to an ESD device.
Figure 12:
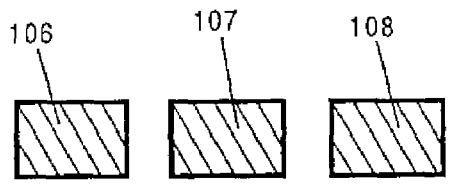
FIG. 12 is a cross-sectional view of a multiple wire interconnect, as viewed along line 12-12 in FIG. 11.

An interconnect 105 can be split into multiple wires 106, 107, 108, as shown in FIGS. 11 and 12. For example, by using ten one-micron wires in parallel, instead of one ten micron wire, the ESD robustness of the interconnect can be improved primarily because the effective insulator volume around the individual wires is increased. The multiple wire arrangement 105 takes up more space, but the ESD robustness of the whole unit is made higher by the spacing between the wires 106, 107, 108.

Figure 13:
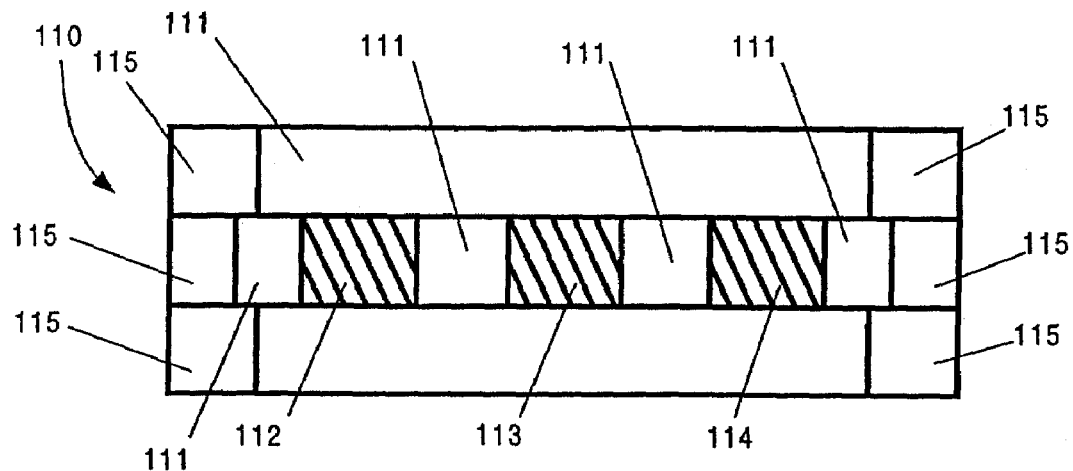
FIG. 13 is a cross-sectional view of a multiple wire interconnect having a high-k material placed above, below, and between the interconnect wires and a low-k material surrounding the high-k material.

FIG. 13 shows a cross section of a multiple wire interconnect 110 having high-k and low-k materials placed according to the present invention. The prior art discloses placing low-k material between the multiple wires of the interconnect. In contrast, the interconnect structure according to the present invention has high-k materials 111 placed between the multiple wires 112, 113, 114 of the interconnect. By forming an interconnect structure in which the minimum line width is used and high-k material is filled in between the wires 112, 113, 114, two ESD advantages are obtained. First, the high frequency component of current will appear through the volume of the wire, so skin effect does not create nonuniform current distribution. Second, by placing a high-k material 111 between the multiple wires 112, 113, 114, the effective width of the interconnect 110 is increased, thereby providing a higher critical current density for the interconnect between the ESD device and the pad.

In this implementation, there is no incentive to fill with low-k material in between the interconnect wires 112, 113, 114 since the line-to-line capacitance is not an issue (the interconnect wires have a common electrical node). The low-k materials 115 can be placed at other places around the interconnect to achieve the desired performance, capacitance reduction, and other properties. This interconnect structure 110 provides the highest critical current density-to-failure, no capacitance impact, and improved high frequency operation, as well as improved polishing characteristics.

According to the present invention, a high-k material is placed next to the interconnect within a thermal diffusion distance of the interconnect to improve the thermal properties and the ESD robustness of the interconnect. The thermal diffusion distance is a function of the pulse time of the circuit in which the interconnect is used. The physical width of the high-k material is preferably at least the thickness or width of the thermal diffusion distance for a pulse of less than approximately 100 nanoseconds. The thermal diffusion distance increases with the width of the pulse.

The material beyond the thermal diffusion distance can be either high-k or low-k material, but is preferably a low-k material. The advantage of the material being low-k beyond the thermal diffusion distance is that the capacitance of the interconnect can be reduced while still achieving an improved critical current density-to-failure. In this way, lower line-to-line capacitance can be achieved between the interconnects while achieving an increased ESD robustness. An improvement in ESD robustness will be observed even if the thickness of the high-k material is less than the thermal diffusion distance. In that case, the improvement will be most beneficial at shorter pulse widths and less advantageous for longer pulse width conditions.

Figure 14:
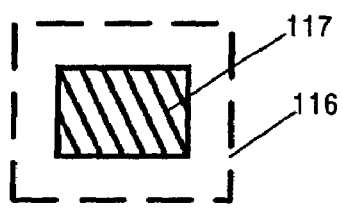
FIG. 14 is a cross-sectional view of a thermal sheath surrounding a single wire interconnect.
Figure 15:
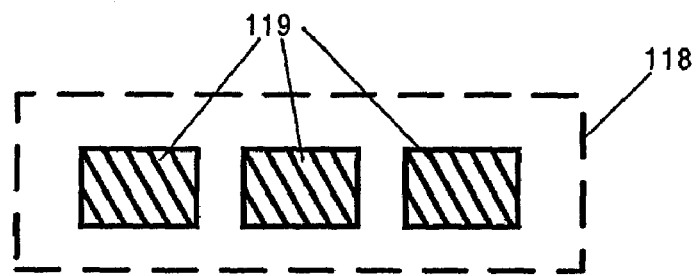
FIG. 15 is a cross-sectional view of a thermal sheath surrounding a multiple wire interconnect.

In FIG. 13, a high-k material 111 is placed on the bottom, top and sides of the multiple wires 112, 113, 114 of the interconnect 110. Thus, each of the interconnect wires 112, 113, 114 is completely encased with a layer of high-k material. The high-k material 111 extends to approximately an outer edge of a thermal diffusion distance of the interconnect wires 112, 113, 114 to provide a thermal sheath surrounding the interconnect wires for improving the thermal properties and ESD robustness of the wires. FIGS. 14 and 15 illustrate a thermal sheath 116, 118 of high-k material surrounding a single wire interconnect 117 and a multiple wire interconnect 119, respectively.

Figure 16:
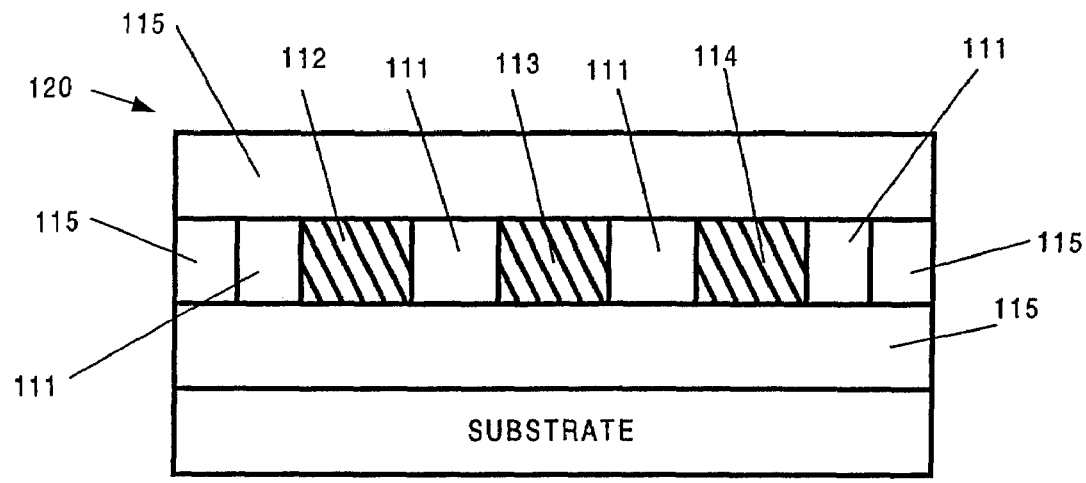
FIG. 16 is a cross-sectional view of a multiple wire interconnect having a high-k material placed between the interconnect wires and a low-k material placed above and below the interconnect wires.
Figure 17:
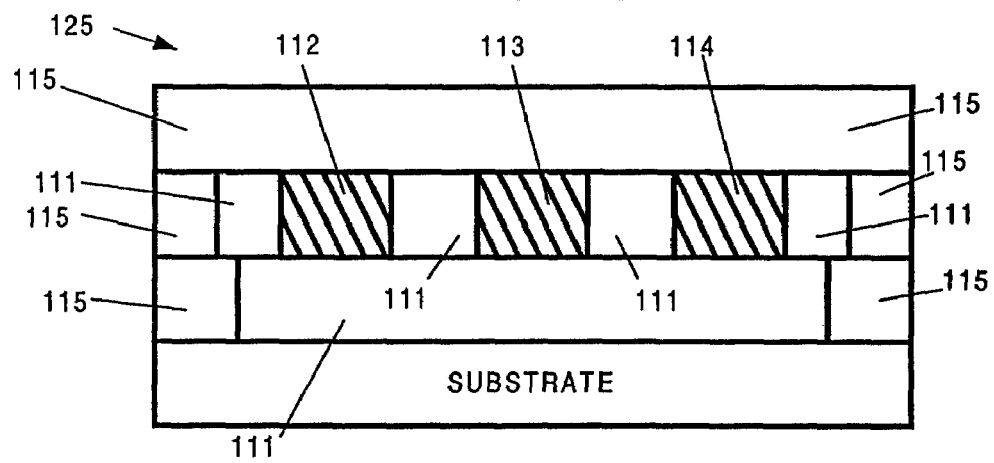
FIG. 17 is a cross-sectional view of a multiple wire interconnect having a high-k material placed below and between the interconnect wires and a low-k material placed above the interconnect wires.
Figure 18:
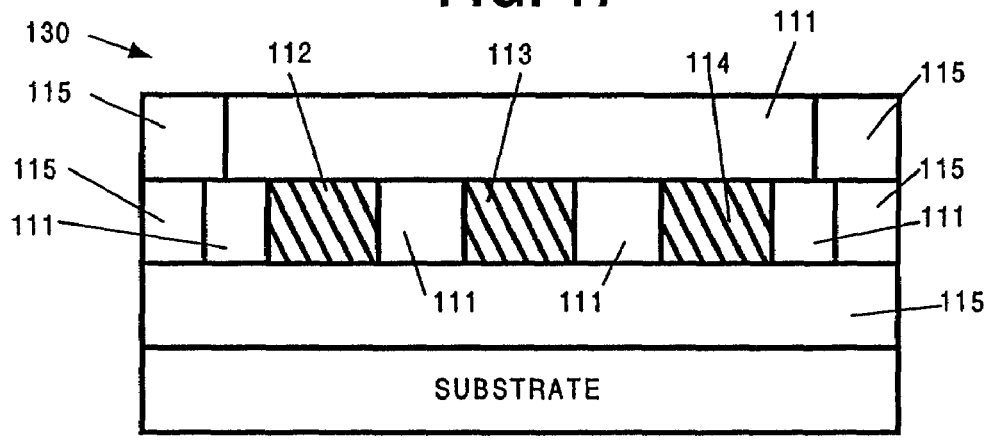
FIG. 18 is a cross-sectional view of a multiple wire interconnect having a high-k material placed above and between the interconnect wires and a low-k material placed below the interconnect wires.

FIGS. 16, 17 and 18 show other embodiments of the present invention in which a high-k material 111 is used in conjunction with a low-k material 115 to achieve a desired ESD robustness and performance objective. FIG. 16 shows an interconnect structure 120 having a single plane of high-k material 111 placed between the multiple wires 112, 113, 114 of the interconnect, with low-k materials 115 placed above, below and on both sides of the interconnect. In some implementations, this arrangement will provide capacitance advantages, although the ESD robustness may not be as good as in the embodiment shown in FIG. 15.

FIG. 17 shows an interconnect structure 125 having a high-k material 111 placed between the multiple wires 112, 113, 114 of the interconnect, a high-k material 111 placed below the multiple wires, and a low-k material 115 placed above the multiple wires and on the sides of the high-k material 111. FIG. 18 shows an interconnect structure 130 having a high-k material 111 placed between the multiple wires 112, 113, 114 of the interconnect 130, a high-k material 111 placed above the multiple wires, and a low-k material 115 placed below the multiple wires and on the sides of the high-k material 111.

The embodiments shown in FIGS. 16, 17 and 18 all have multiple wire interconnects with high-k material 111 placed between the multiple wires 112, 113, 114. As shown in these figures, the high-k material 111 can be placed above and/or below the multiple wires, depending upon the particular capacitance and thermal properties desired for the interconnect.

Figure 19:
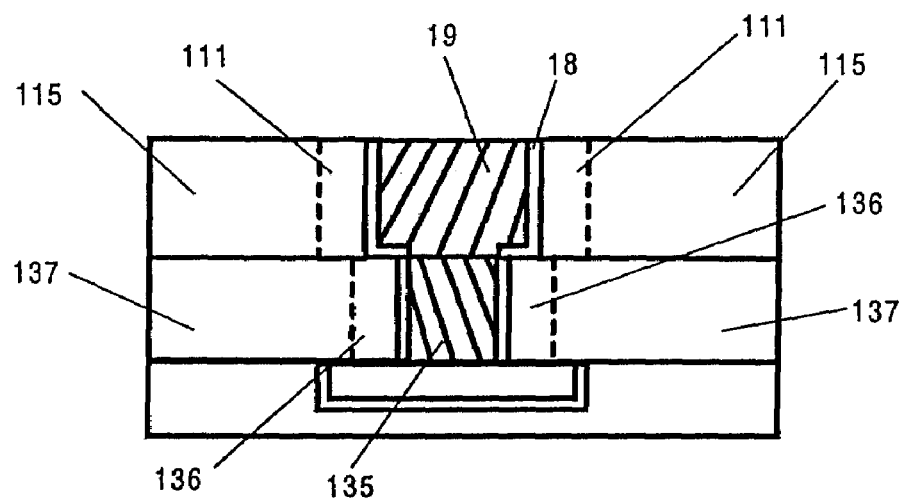
FIG. 19 is a cross-sectional view of a via structure encased with a layer of high-k material according to the present invention.
Figure 20:
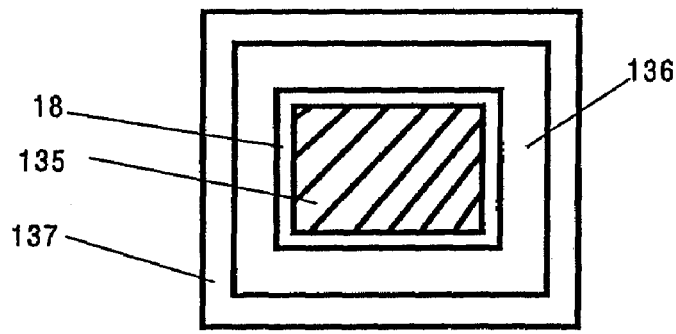
FIG. 20 is a plan view of the via structure shown in FIG. 19.

FIG. 19 shows a cross section of a via structure 135 encased with a layer of high-k material 136 according to the present invention. FIG. 20 is a plan view of the via structure 135 shown in FIG. 19. A via structure is a stud that goes between two existing layers of metal film. The via structure 135 shown in FIG. 19 has a generally square-shaped column of high-k material 136 surrounding the via structure 135, and a low-k material 137 surrounding the high-k material 136. This arrangement of high-k and low-k materials improves the robustness of the via structure 135 because as the via heats up, the heat diffuses into the physical volume of the high-k material 136. Thus, the high-k material 136 has the effect of making the via structure 135 appear to have a larger physical thermal volume. The via 135 can be placed through a region where the high-k material 136 is predefined as a column surrounded by low-k material 137.

Figure 21:
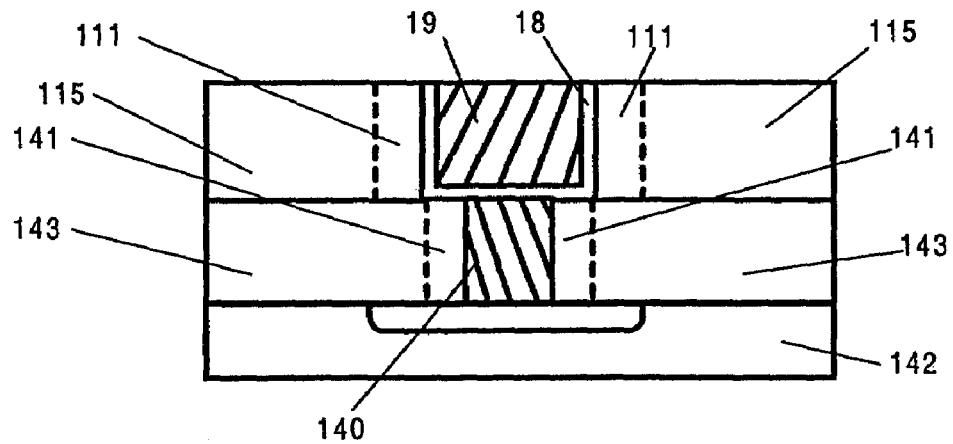
FIG. 21 is a cross-sectional view of a contact structure encased with a layer of high-k material according to the present invention.

FIG. 21 shows a cross section view of a contact structure 140 encased with a layer of high-k material 141 according to the present invention. The contact structure 140 extends down to the surface of the silicon substrate 142 and is connected to a higher level metal. The contact structure 140 is encased with high-k material 141, similar to the via structure 135 shown in FIGS. 19 and 20. The high-k material 141 is surrounded by low-k material 143. Thus, the contact structure 140 has better thermal properties and a higher ESD robustness due to the diffusion of heat into the physical volume of the high-k material 141, and reduced capacitance due to the low-k material 143.

As explained above, the basic concept of the present invention is to place two insulator materials having different thermal properties around the interconnects extending between a pad and a current discharging or current sinking device. The trend in the semiconductor industry is to do just the opposite; that is, to place low-k material around the interconnects to improve performance. The present invention provides an arrangement that improves the thermal properties and ESD robustness of the interconnect by using a high-k material placed local to at least one edge of the interconnect within the thermal diffusion distance of the interconnect, rather than focusing primarily on low-k materials to improve the performance of the interconnect.

The role of an ESD device is to sink or discharge the current to avoid over voltage of an I/O network. The ESD robustness is more important for an ESD device than the performance of the ESD device. In contrast, the performance of a receiver device is typically more important than the ESD robustness. The invention also has applicability to an arrangement in which a driver is used in place of the receiver 80 shown in FIG. 7, and a driver network is used in place of the ESD device 78 shown in FIG. 7. The invention also has applicability with interconnects that extend between a pad and an I/O network that provide ESD protection (also referred to as self-protecting drivers). The ESD device takes care of the discharging process by dumping the current to a voltage source or to ground and preventing failure of the internal circuits.

The present invention also has applicability to a bidirectional integrated circuit having a pad, a first interconnect wire, and a driver, and a second interconnect wire that extends between the pad and a receiver circuit in parallel to the first interconnect. The same architecture is provided as shown in FIG. 7, except that the ESD is in the form of a driver, and the receiver circuit is connected in parallel to the pad, rather than in series. The role of the driver is to discharge a current, similar to the ESD device 78 in the embodiment shown in FIG. 7. Although a low-k material is typically used to obtain performance advantages, the present invention uses a high-k material to obtain thermal advantages in this case, thus improving ESD robustness of the integrated circuit.

The focus in the industry, especially with integrated circuits, is to move the low-k materials near the interconnect wires. The low-k materials function to reduce capacitance of the interconnect and to reduce crosstalk noise between adjacent wires in the interconnect which are carrying different signals from different pads. In contrast, the present invention is directed to improvements in multiple wire interconnects that are connected to the same pad. Such multiple wire interconnects have no problems with crosstalk or capacitive coupling between the wires because they are connected to the same pad. The present invention uses high-k material positioned adjacent to at least one surface of the interconnect wire to achieve a thermal advantage that improves ESD robustness of the interconnect wire.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teachings without departing from the spirit and scope of the following claims.

What is claimed is:

1. A method, comprising:
   electrically interconnecting a pad and an electrostatic discharge (ESD) device using an interconnect comprising a plurality of interconnect wires having a common electrical node in a wiring level on a substrate;
   substantially filling a high-k material at least in a region in between said interconnect wires, said region extending from a sidewall of one of said interconnect wires to a sidewall of an adjacent one of said interconnect wires; and
   placing a low-k material adjacent to the interconnect and located outside of said region that is substantially filled by said high-k material.

2. The method according to claim 1, wherein the high-k material is disposed between the low-k material and at least one of the interconnect wires and the high-k material has a thickness equal to or greater than a thermal diffusion distance of the interconnect.

* * * * *